United States Patent
Evans et al.

(10) Patent No.: US 8,885,477 B2
(45) Date of Patent: Nov. 11, 2014

(54) METHOD, DEVICE AND SYSTEM FOR COMPRESSING TIME SERIES DATA

(75) Inventors: David John Evans, Frankfurt am Main (DE); Ugo Moschini, Viareggio (IT)

(73) Assignee: European Space Agency, Paris (FR)

( * ) Notice: Subject to any disclaimer, the term of this patent is extended or adjusted under 35 U.S.C. 154(b) by 0 days.

(21) Appl. No.: 14/240,705

(22) PCT Filed: Aug. 26, 2011

(86) PCT No.: PCT/EP2011/064696
§ 371 (c)(1),
(2), (4) Date: Feb. 24, 2014

(87) PCT Pub. No.: WO2013/029646
PCT Pub. Date: Mar. 7, 2013

(65) Prior Publication Data
US 2014/0161139 A1    Jun. 12, 2014

(51) Int. Cl.
*H04L 1/00* (2006.01)
*H04L 29/06* (2006.01)
*H03M 7/48* (2006.01)
*H03M 7/30* (2006.01)

(52) U.S. Cl.
CPC ................. *H04L 69/04* (2013.01); *H03M 7/48* (2013.01); *H03M 7/3066* (2013.01)
USPC ............................ 370/235; 370/311; 370/468

(58) Field of Classification Search
CPC .................................................. H04L 63/0263
USPC .......................................... 370/235, 311, 468
See application file for complete search history.

(56) References Cited

U.S. PATENT DOCUMENTS

| 5,845,243 A * | 12/1998 | Smart et al. ................. 704/200.1 |
| 2004/0113820 A1 * | 6/2004 | Leanza ............................ 341/50 |
| 2008/0046686 A1 * | 2/2008 | Cameron ......................... 712/22 |
| 2014/0105022 A1 * | 4/2014 | Soni et al. ...................... 370/235 |

OTHER PUBLICATIONS

Reinhardt et al., "Stream-oriented Lossless Packet Compression in Wireless Sensor Networks," *6th Annual IEEE Communications Society Conference on Sensor, Mesh and Ad Hoc Communications and Networks, Secon '09*, Jun. 22, 2009, pp. 1-9, Piscataway, New Jersey, USA.

Staudinger et al., "Lossless Compression for Archiving Satellite Telemetry Data," *Aerospace Conference Proceedings, IEEE*, Mar. 2000, pp. 299-304, vol. 2, Piscataway, New Jersey, USA.

(Continued)

*Primary Examiner* — Wanda Z Russell
(74) *Attorney, Agent, or Firm* — Oliff PLC

(57) ABSTRACT

A mask packet is provided with bits in a ONE state for all predictable bit positions and with a ZERO state for all unpredictable ones. All predictable bit positions of the new data packet are brought into a ZERO state if an actual bit state matches the predicted bit state and into a ONE state if the actual bit state does not. A processed packet is generated by applying an AND operation between the new data packet and the mask packet to change all unpredictable bits to a ZERO state. A series of counters is provided by calculating the number of bits in the processed packet between the first bit and the first bit with a state ONE; and between the following bits with a state ONE and between the last bit with a state ONE and the last bit in the processed packet. The counters are stored or transmitted.

36 Claims, 10 Drawing Sheets

(56) References Cited

OTHER PUBLICATIONS

Jonsson et al., "The RFC 3095 Implementer's Guide; draft-ietf-rohc-rtp-impl-guide-15.txt," Aug. 26, 2005, pp. 1-23, vol. rohc, No. 15.

International Search Report issued in International Application No. PCT/EP2011/064696 dated Apr. 19, 2012.

Written Opinion of the International Searching Authority issued in International Application No. PCT/EP2011/064696 dated Apr. 19, 2012.

* cited by examiner

| Abs | Order |
|-----|-------|
| 8   | 17    |
| 21  | 14    |
| 23  | 19    |

METHOD, DEVICE AND SYSTEM FOR COMPRESSING TIME SERIES DATA

The present invention relates to a method for compressing time series data, to a telemetric device, a central processing unit and to a system for processing telemetric time series data.

A particular, but non-exhaustive, application of the invention lies in space missions where onboard technical devices of remote systems (e.g. satellites, spacecrafts, rovers) need to be monitored remotely at high precision by measuring a plurality of technical parameters in the form of telemetry time series data. The measured time series data are usually downlinked to ground stations for further analysis. Such time series data are sampled at regular intervals, typically at the associated packet rate from the spacecraft data pool and inserted into a downlink packet. Sampling and downlinking time series data at high frequency is a prerequisite for capturing and monitoring short-lived events and for obtaining high fidelity data. However, the monitoring accuracy is usually limited by the bandwidth available to downlink the data and the available on-board processing capabilities.

A proposed solution in the prior art is to compensate for the limited bandwidth by means of compression techniques, wherein the measured telemetric data is encoded before being downlinked through the use of specific encoding schemes using fewer information-bearing units than an unencoded representation would use. Thus, the receiver of the transmitted compressed data needs to understand the encoding scheme and to be able to decode or decompress the received data.

In particular lossless compression techniques (e.g. zip) require the loading of complicated software to the transmitter and they consume valuable CPU power which is often a limited resource at remote systems, in particular, on-board a space exploration vehicle. Simple lossless compression techniques that consume less CPU power (e.g. RICE) do not compress this sort of data well enough to justify their implementation, Whereas science data is routinely compressed, this is not the case for housekeeping telemetry data since they are often low volume compared to science data. However, many missions are dominated by housekeeping telemetry by design (technology demonstrators and educational missions) and all missions have periods that are dominated by housekeeping telemetry (LEOP and commissioning, emergencies and recovery, cruise phases of interplanetary missions). In all of the above cases compression of housekeeping data would bring major benefits in terms of using less bandwidth, reducing reaction times, requiring less power for transmission, requiring less engineering effort in the packet and telemetry system design etc. However to be worth it, the compression must work well, be lossless, use simple algorithms and not require much on-board processing power. The recommended compression method for space usage is RICE. This is used extensively for science data however it does not compress housekeeping data well—in fact it sometimes expands it.

Other compression methods such as winzip and 7zip compress well but require complicated code to be loaded into the spacecraft's memory, require a relatively high level of processing power and would require a certain amount of data to be stored before the compression would work.

Staudinger et al. (Aerospace Conference Proceedings, March 2000, IEEE vol. 2, pp. 299-304) propose a lossless compression method for archiving satellite telemetry data on the ground. The method exploits the fact that the probability of a change in the bit state between successive, identical bits in a packet tends to remain constant in time for each bit. However, the method is practical for archiving telemetry on the ground but not on-board since it requires using zip for compressing the reference packets and thus, extra on-board software and processing power. Another disadvantage is that the method uses a run length substitution algorithm in the coding step so that an interim packet has to be created and filled with all the results for the bit calculations. Then a second pass is made to replace the different words by associated code words. The proposed run length code word table, the transformation tables and the probability tables must all be accessed frequently, making the compression process very slow so that it is not suitable for compressing data packets in real-time. Furthermore, the resulting compression performance is not stable for "real" telemetry data where the actual probability of change can vary from the calculated probability of change over time. As the Staudinger method incurs a very high penalty for changes of this nature it was found to be unstable for time periods of just a few hours. Staudinger et al. therefore propose to zip the compressed packets and to recalculate all the tables every hour, making such an approach not practical for on-board usage.

In view of the above problems of the prior art, the present invention seeks to enable the observability of remote systems at higher fidelity and reduced bandwidth. It is a further object of the invention to provide a method capable of compressing telemetry time series data in near real-time while requiring less processing power and achieving a higher compression ratio.

The invention is set forth and characterized according to the subject-matter of the independent claims, while the dependent claims describe preferred embodiments of the invention.

A method for processing time series data is proposed so that the processed time series data can be more efficiently transmitted using less bandwidth or can be more efficiently stored using less storage space. In particular, the invention provides a lossless method of compressing time series data packets as they are generated in near real-time. The term "data packet" applies to any fixed length message, consisting of fields fixed in position/bit length and in which each field corresponds to a particular measurement. Preferably, the time series data are telemetric time series data, such as spacecraft housekeeping telemetry data or telemetric parameters used to monitor remotely the operation of a remote device. Preferably, the method is applied to time series data of repeated measurements of a connected, physically constrained system. Repeated measurements of a physically constrained, connected system, such as a satellite, a spacecraft, a space rover, an oil rig, a vehicle, a factory, an aircraft, a submarine or a ship, generate time series data with statistical properties that can be exploited by the present invention.

According to the invention, packets may be compressed individually rather than having to wait for a critical number of packets to be grouped together. This makes it suitable for compressing telemetry data that is used for real time control as well as telemetry data used for analysis of the state history of the connected, physically constrained system.

The proposed method relies on a statistical analysis of historical measurement data of the measurement system to calculate the probability of each bit in a packet changing state or being in a ZERO ("0") or ONE ("1") state. The predictability of the state of each bit in a data packet may be determined based on pre-determined time series data of the system, wherein a bit state is predictable if its state can be predicted with a probability that is higher than a predetermined threshold and unpredictable if the probability is below or equal the threshold. The pre-determined time series data are historical time series data, i.e., time series data measured previously or time series data measured in a predetermined past time interval of the connected, physically constrained system.

By way of example, the predictability of the state of each bit in a data packet is determined based on a static prediction or a state of another bit in the packet. The predictability of the state of each bit in a data packet may also be determined based on a state of the bit in the last packet generated or a change in state of another bit in the packet or the amount of packets generated since the last change in state of the bit.

According to another aspect of the invention, a packet is provided (hereinafter referred to as a mask packet) with bits in a ONE state for all predictable bit positions of the data packet and with bits in a ZERO state for all unpredictable bit positions.

According to another aspect of the invention, bit operations are carried out on a new data packet to bring all predictable bit positions of the new data packet into a ZERO state if an actual bit state matches the predicted bit state and into a ONE state if the actual bit state does not match the predicted bit state. These bit operations (hereinafter referred to as preparation bit operations) are determined based on the selected method for determining the predictability of the state of each bit in a data packet. The term "new data packet" refers to a newly generated data packet in contrast to the historical time series data that has been generated previously.

Instead of bringing all predictable bit positions of the new data packet into a ZERO state if an actual bit state matches the predicted bit state and into a ONE state if the actual bit state does not match the predicted bit state, these particular bit states are only exemplary and the opposite bit states could be selected. For the sake of simplicity, only one of the two equivalent alternatives is described.

According to a further aspect of the invention, a processed packet is provided by applying an AND operation (using a bitwise AND operator) between the new data packet on which the bit operations have been performed and the mask packet to change all unpredictable bits to a ZERO state. A series of counters is then provided by calculating the number of bits in the processed packet between the first bit and the first bit with a state ONE; and between the following bits with a state ONE and then between the last bit with a state ONE and the last bit in the processed packet. Thus, the method calculates the distance between the ONEs in the processed packet.

This coding of the counters represents a run-length encoding scheme. The better the bits of a new data packet match their predicted states, the greater the numbers of consecutive ZEROs and the better the resulting compression using the counters. Preferably, the coding of the counters may be performed by using byte or bit type run length encoding schemes on the processed packet to increase the processing speed and efficiency.

According to a further aspect of the invention, the series of counters are written into an output data packet. The output data packet may be stored or transmitted.

The proposed method operates at the packet level. and consists almost entirely of word length bit operations such as OR, XOR and AND. Word length bit operations are native operations to any processor and can be executed in a single clock cycle so that 16, 32 or 64 operations (depending on word length) are done in a single cycle. There are a number of single bit XORs operations required but their number is rather low and these are still fast compared to calculations.

The bit operations are used to generate a processed packet in which bits with a state ONE correspond to a predictable bit whose state does not match the predicted state. This information can be efficiently coded into counters by determining the distance between bits with a ONE state in the processed packet using counters. According to the proposed compression technique, calculations (which take time and consume valuable CPU resources) are only required when low probability events happen and not when high probability events happen. Hence they are minimized. For example, if the majority of bit states of those bits that have been classified as predictable are as expected, then almost no calculation is required to produce the output packet—just bit operations.

According to a further aspect of the invention, the time series data may be compressed in either a first mode or a second mode. Alternatively, a combined approach using both the first and second mode may be used as will be explained in more detail below.

In a first mode (hereinafter also referred to as the CHAIN mode since it is applied to an uninterrupted sequence of data packets (a chain of packets), the method may further comprise the step of XORing the new data packet with the last data packet generated for that packet type, wherein the predictability of each bit in the new data packet is based on the probability of the bit changing state each time a new packet is generated.

XORing the new data packet with the last data packet generated for that packet type refers to carrying out an XOR operation between corresponding bits of two subsequent data packets of the same packet type. The probability of the bit changing state each time a new packet is generated means the probability of the bit in the new packet having changed state from the state the corresponding bit (i.e., the bit at the same position in another data packet) had in the last packet generated.

Preferably, the probability of each bit in the data packet changing state at the same time as another bit in the data packet is also calculated. If this probability is higher than the probability of the bit changing state each time, then this probability will be used to determine the predictability of the state of each bit and an XOR with that bit following the step of XORing the new data packet with the last data packet generated for that packet type is chosen as one of its preparation bit operations.

Preferably, the probability of a bit changing state an equal number of packets as between the last two changes of state for the bit may be calculated. In other words, the number of packets is counted that has been generated between bit state changes and then the probability may be calculated that between the same number of packets the change will occur again in the future. If this probability is higher than the probability of the bit changing state each time or it changing state at the same time as another bit in the packet then this probability may be used to determine the predictability of the state of each bit. A flag is set to invert the bit in the processed packet when an equal number of packets have been generated as those that occurred between the last two state changes for that packet.

Using different methods of statistical analysis of historical data and selecting the "best" one, i.e. the one with which a bit state or a change in a bit state can be predicted with the highest probability, increases the compression ratio and the speed of the compression method.

According to a further aspect of the invention, the time series data may be compressed in a second mode (hereinafter also referred to as the REFERENCE mode), wherein no XOR with the last data packet generated for that packet type is carried out and the predictability of each bit in the data packet may be based on the probability of the bit being in a static ZERO or ONE state, whichever is higher.

According to a further aspect of the REFERENCE mode, the probability of each bit in the data packet having the same state at the same time as another bit in the data packet may be calculated and if this probability is higher than the probability of the bit being in a static state then this probability may be used to determine the predictability of the state of each bit. In this case, an XOR with that bit may be chosen as one of its preparation bit operations. The REFERENCE mode is more robust than the CHAIN mode. The CHAIN mode has the advantage that the compression performance is better but the disadvantage that if a packet is lost, the chain will be broken and further CHAIN mode packets cannot be decoded. Therefore, according to a further aspect of the invention, a combination of the first mode and the second mode may be used for compressing the data packets.

Preferably, a packet is compressed using the second mode every X packets having been compressed with the first mode; X being a predetermined number. The maximum impact of a single packet loss is the loss of the next X packets. By varying the number of chain packets between the reference packets, overall compression performance can be increased.

Alternatively, a packet being compressed with the second mode may be overlaid, i.e., may be provided additionally every X packets having been compressed with the first mode. This has the advantage that backtracking can be employed. It is possible to work back from a REFERENCE packet as well as forward. This is the most sensible option for data that is not time critical.

Alternatively, data packets may be compressed and transmitted using the first mode, wherein the method may further comprise the step of requesting a packet being compressed in the second mode in real-time if a chain of subsequently compressed data packets is interrupted. This is the most sensible option for data that is not time critical and for which a data link with a reasonable communication time is available.

According to a further aspect of the invention, the preparation bit operations may further comprise the step of XORing the packet resulting from all other preparation bit operations with an inversion packet in order to invert all the bits in a packet that have been flagged as inversion bits. The inversion packet is created beforehand with a ONE state for all bit positions that require an inversion each time and a ZERO state for those that do not. The inversion operation converts all predictable bit states into the same state, either a ZERO or a ONE state using a single efficient Word operation.

According to a further aspect of the invention, the method may further comprise the steps of extracting the non-predictable bits from the new data packet via a set of extract bit operations; and writing the remaining unpredictable bits to the output data packet. Preferably, the non-predictable bits may be extracted by performing an OR operation between the new data packet and the mask packet to change all predictable bits to a ZERO state and then bit shifting and ORing together the words of the resulting packet to remove the ZEROs associated with the predictable bits. Alternatively, the non-predictable bits may be extracted by performing an OR operation between the data packet that results from applying the preparatory bit operations on the new data packet and the mask packet.

According to a further aspect of the invention, a check may be made of the number of ONEs in the processed packet and if this exceeds a threshold then the compression is abandoned. This allows the method to automatically exit the compression process using a simple stop criterion if the bit states deviate significantly from their statistically predicted states which is important when applying the proposed method for real-time compression and transmission of time series data.

According to a further aspect of the invention, the method may further comprise at least one of the following steps in order to transmit the compressed data packets in real-time: Adding a fixed length header to the output packet, the fixed length header comprising a status bit indicating whether the data packet is compressed, the mode in which it was compressed, the length of the packet in bytes and a sequence counter to ensure that the compressed packets are decompressed in order; removing the first or last counter; adding a extra bit in a ONE state to the end of the output packet data; and adding the correct number of ZERO bits to the end of the output packet data to complete the number of bytes as indicated in the header.

Alternatively, instead of a byte counter being added to the header and a final bit in state ONE being added to the end of the output packet, a first counter may be added which describes how many other counters there are in the packet.

In order to further increase the speed of compressing a new data packet, the calculation of the number of bits between bits in state ONE and the start and the end of the processed packets may be based on calculating word offset via memory addressing for the byte difference and then adding the bit offsets. This aspect exploits the fact that the method works with fixed length packets. Since the predictable bits that have a state that does not match the predicted state are characterized by a ONE state in the processed packet, the method needs to determine the distance between the ONEs in the processed packet. Since memory addressing works on bytes or words, the distance between bits (each bit having a memory address) with a ONE state can be efficiently derived from word offset via memory addressing.

According to a further aspect of the invention, the coding of the counters may be based on two counters, the first one coding how long the second counter is in bits. This enables a very deterministic decoding procedure in order to further increase the decoding speed by encapsulating the coded information. Alternatively, the coding of the counters may be based on splitting the bits that make up the counter value into different groups and by adding concatenation bits between the groups to indicate if the next group should be concatenated or if the counter is finished. This coding scheme can effectively code any count length.

According to a further aspect of the invention, a lot of the bit state changes tend to happen together for certain time series data, i.e. the ONEs in the processed packet tend to group. This can be exploited by using a modified coding scheme: Each counter may be followed by a single bit flag indicating if it is followed by a bit with a ONE state and if true this is repeated until false whereby a bit flag with an opposite value is inserted and the following bits describe the next counter.

According to a further aspect of the invention, absolute bit positions relative to the start of the processed packet of all the bits with state ONE in that packet may be transformed into order numbers based on a pre-determined lookup table, wherein the lookup table has been calculated beforehand based on descending predictability of each bit based on historical data. Thus, the lookup table assign an order number to each bit based on a determined descending predictability.

Preferably, the calculations of the counter values may be based on the differences in the order numbers in descending order. This increases the compression performance as the differences between order numbers tend to be smaller than the differences between absolute bit positions. Firstly, only bits with a state ONE are looked up which should be very rare if the statistical prediction is reliable. Secondly, by using the look-up table that ranks the bits based on descending predictability, the bits with the highest predictability are counted first so that the first counters usually code the longest sequence of ZEROs and thus, a single counter value can code a large amount of data. Using the look-up table that ranks the bits based on descending predictability, an enormous amount of information can be coded using only the first counters that represent very highly compressed data.

Due to the statistical nature of predicting the bit state, it is not determined how much information will be coded with the first counters. According to a further aspect of the invention, the difference between a predetermined minimum order number and the next greatest order number, plus the delta differences between all order numbers higher than this are passed to a separate process which stores and transmits them separately to the compressed packets. Hence, the method can be set up to guarantee that all information carried in the bits corresponding to the highest order number in the look-up table down to the minimum order number in the look-up table are encapsulated in these counters. In particular, following a period where data has been stored on-board this makes it possible to send the highly compressible part of the stored data first before sending the non-compressible part. As the content of the highly compressible part is guaranteed and carries the majority of the information in the stored data it can be used for a quick assessment of the evolution of the unit's state without waiting for the complete data to arrive.

According to a further aspect of the invention, counters and selected non-predictable bit states may be stored in separate packets and transmitted separately to packets containing the rest of the non-predictable bit states. When many packets have been stored onboard this allows the possibility of sending all the highly compressed part of those packets together first rather than each compressed packet sequentially.

A further aspect of the invention relates to a central base station, a telemetric device and to a system comprising the central base station and the telemetric device that are configured to execute the proposed method.

In particular, a central base station for processing and receiving time series data is proposed that comprises a central processing unit. The central processing unit is configured to determine the predictability of the state of each bit in a data packet. Preferably, the state of each bit in a data packet may be predicted based on a static prediction or the state of another bit in the packet or the state of the bit in the last packet generated or a change in state of another bit in the packet or the amount of packets generated since the last change in state of the bit. The central processing unit is further configured to determine for each bit in the data packet whether its state is predictable by determining whether its state can be predicted with a better probability than a predetermined threshold. The central processing unit is further configured to create a mask packet. A mask packet is a data packet with bits in a ONE state for all predictable bit positions and with bits in a ZERO state for all unpredictable bit positions.

The central processing unit m further configured to create a set of bit operations, such as an XOR instruction set and an inversion packet that transform a newly generated data packet and/or the last packet in a data packet wherein predictable bits are in a ZERO state if the prediction was correct and a ONE state if the prediction was incorrect. The central processing unit may be further configured to determine extract bit operations for removing the predictable bits from a data packet created from a data packet generated using an OR operation of the new data packet and the mask packet and creating an extract instruction set for this operation. Instead of using the new data packet for the OR operation with the mask packet, also the data packet resulting from applying the XOR instruction set and/or the inversion packet on the new data packet may be used.

The central base station may further comprise a sender/receiver unit configured to transmit the generated mask packet, inversion packet, the XOR instruction set and the extract instruction set to the telemetry device; and to receive compressed packets from the telemetry device.

The central processing unit may further be configured to interpret the received counters included in the compressed packets received from a telemetry device and to recreate a processed packet and using equivalent bit operation instructions in order to reconstruct the original data packet.

The central base station may further be configured to regularly provide updated version of the mask packets, inversion packets and instruction sets based on newly generated historical telemetry time series data.

A further aspect of the invention relates to a telemetry device configured to compress and store or transmit time series data. The telemetry device comprises a first storage area configured to store the last packet generated for each type of packet; a second storage area configured to store at least one mask packet; a third storage area configured to store at least one inversion packet; a fourth storage area configured to store at least one XOR instruction set; a fifth storage area configured to store at least one extract instruction set; a packet processing means for compressing telemetric time series data, a receiver configured to receive the mask packet, inversion packet and the instruction sets; and a sender unit for transmitting the data packets compressed by the packet processing means. The above storage areas may be implemented using a single or multiple storage units.

According to a further aspect of the invention, the packet processing means may be configured to carry out an XOR operation of a newly generated packet with the last packet generated of that type, if the predictability of the state of each bit in a data packet is determined based on a state of a bit or a change in state of another bit (CHAIN mode). According to a further aspect of the invention, the packet processing means is configured to perform XORs between bits in the resulting packet according to the XOR instruction set; to XOR the resulting packet with the inversion packet; and to AND the resulting packet with the mask packet to create a processed packet.

According to a further aspect of the invention, the packet processing means is configured to calculate the number of bits between the first bit in the processed packet and the first bit with a state ONE and then between the following bits with a state ONE in the processed packet and then between the last bit with a state ONE and the last bit in the processed packet. The results of the calculations may then be coded as counters written into an output data packet.

According to a further aspect of the invention, the telemetry device may further be configured to OR the original data packet with the mask packet; to perform the extract bit operations on the resulting packet; to write the result into the output data packet; to append a fixed length header to the output data packet, to add a one bit at the end of the data, to add zero bits to complete the exact number of bytes as described in the header; and to transmit the packet to the base station.

According to a further aspect of the invention, the telemetry device may be configured to decide for each data packet whether it should be compressed or not. According to a further aspect, the packet processor may selectively compresses the data packets according to a predetermined ratio of compressed to uncompressed data packets the telemetry device has received from the central base station.

The invention is explained below in an exemplary manner with reference to the accompanying drawings, wherein FIG. 1 shows a flow diagram that illustrates the main preparation steps of the compression method according to an embodiment of the invention;

Figure 1:
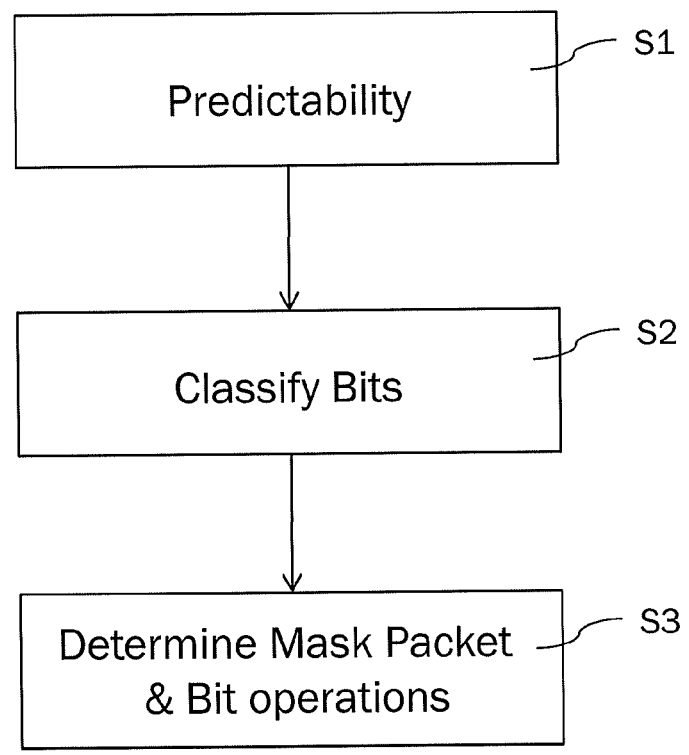

FIG. 1 shows a flow diagram that illustrates the main preparation steps of the compression method according to an embodiment of the invention. The proposed compression method is particularly suited for housekeeping data which describes the current operating state of a device or a system or for time series data generated by repeated measurements of a connected, physically constrained system. After appropriate treatment such measurements exhibit sufficient predictability at the bit level that they can be exploited by the proposed invention.

The proposed method relies on a statistical analysis of historical data of the system or device to determine the predictability of each bit of a data packet generated by the measurement system. In step S1, the predictability of each bit in a data packet is determined based on historic data. Based on the results, each bit in the data packet is then classified in step S2 as predictable or non-predictable. Finally, in step S3, a set of bit operations and data packets are prepared that can later be applied to a newly generated data packet in order to compress the newly generated data packet in near real-time using almost entirely word length bit operations such as OR, XOR and AND. The steps S1 to S3 illustrated in FIG. 1 are typically performed at a central station that has access to stored historical time series data.

In step S1, historical time series data, i.e., time series data of a system measured previously (e.g. telemetry housekeeping data of a satellite that has been measured and downlinked to a ground station) is statistically analyzed to calculate the predictability of each bit in a data packet. Time series data are typically transmitted in data packets consisting of fields fixed in position/bit length and in which each field corresponds to a particular measurement. The predictability of each bit in a data packet is calculated as the probability of each bit in a packet being in a ZERO or ONE state or as the probability of each bit in a packet changing state. The invention is not restricted to a particular calculation method to determine the predictability of the state of each bit in a data packet. For example, the predictability can determined based on a static prediction or a state of another bit in the packet. The predictability of the state of each bit in a data packet may also be determined based on a state of the bit in the last packet generated or a change in state of another bit in the packet or the amount of packets generated since the last change in state of the bit.

Preferably, the method that produces the highest predictability is chosen for a particular time series parameter. According to a preferred embodiment, the predictability of each bit is calculated using different criteria according to the mode:

According to a first mode, also called the CHAIN mode, previous packet information is required. The predictability of each bit is calculated as the probability that a bit has the same state as its state in the last packet generated, or a bit changes its state at the same time as another bit in the packet (change correlated with another bit), or a bit changes state after the same number of packets as those that occurred between the last two bit state changes (also referred to as time correlation, will be described later in more detail).

According to a second mode, also called the REFERENCE mode, no previous packet information is required. The predictability of each bit is calculated as the probability that a bit has the same state as a static prediction, or a bit has the same state at the same time as another bit in the packet (state correlated with another bit).

For the selected mode, probabilities are calculated for each of the criteria in step S1. Probability values that are below 0.5 are then taken away from 1. The predictability for each bit is then given by the highest probability value of each of the criteria. If the predictability figure was the result of a probability value that was originally below 0.5 then it is flagged for inversion. These bits are still predictable, they only have the opposite behaviour which can be dealt with by inverting the result. For example, if historical data on the ground is used to calculate the probability of a bit changing state between successive packets and if the estimated probability is 0.9 for a first bit and 0.1 for a second bit, the predictability of the two bits is the same (90%). This can be understood in the sense that a parameter that changes 90% of the time i.e. probability of change is 0.9, is actually very predictable.

If the predictability figure was the result of a criteria based on correlation with another bit (either static or change) then it is flagged in the preparation instructions to be XORed with that bit. If the predictability figure was the result of a criteria based on time correlation then it is flagged to be treated as such in the preparation bit instructions (see description below).

In step S2, the bits in the data packet are classified as predictable or non-predictable based on the statistical analysis conducted in step S1, wherein a bit state is predictable if its state can be predicted with a probability that is higher than a predetermined threshold and non-predictable if the probability is below or equal the threshold.

In step S3, the results of the predictability analysis is used to determine the required bit operations to be performed on a newly generated data packet so that predictable bits are in a ZERO state if the prediction was correct and in a ONE state if the prediction was incorrect. This will be illustrated in FIGS. 2-6.

The bit operations depend on the selected calculation method for determining the predictability. Therefore, an inversion packet is provided that identifies the bits in the data packet that have been inverted. If the predictability figure was the result of a criteria based on correlation with another bit (either static or change) then it is flagged in the preparation bit instructions to be XORed with that bit. The required bit operations are provided as an XOR instruction set for performing the bit XORs part of the preparation bit operations and an inversion packet for the inversion part. Furthermore, a mask packet is provided that comprises bits in a ONE state for all predictable bit positions of the data packet and with bits in a ZERO state for all unpredictable bit positions. The mask packet has the same packet length, i.e., number of bits as the data packets of the time series data. In addition, the extract bit operations are determined which can remove the predictable bits from a data packet created from an OR of the original data packet and the mask packet and an extract instruction set is created for this operation.

The mask packet, inversion packet, the XOR instruction set and the extract instruction set are then transmitted to the telemetry device. Preferably, updated version of the mask packets, inversion packets and instruction sets are provided regularly to the telemetry device based on newly generated historical telemetry time series data.

Figure 2:
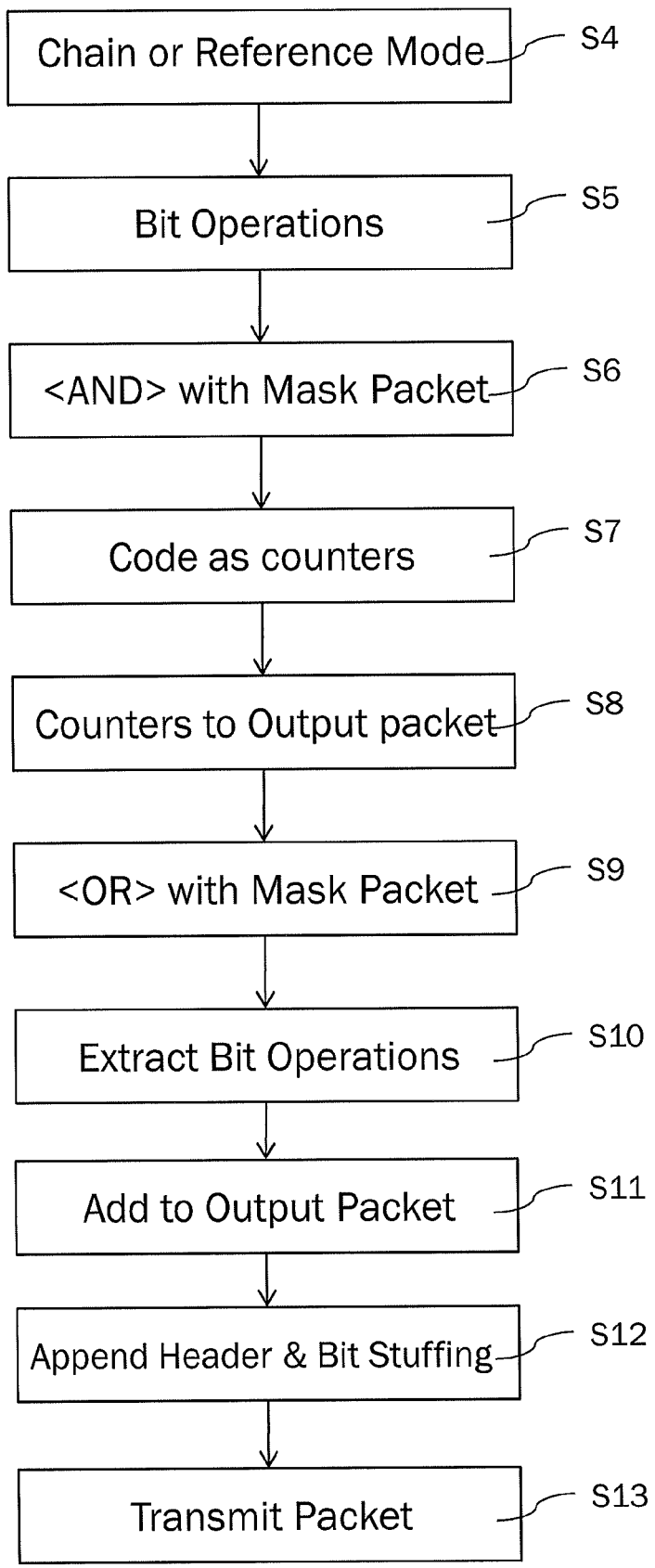
FIG. 2 shows a flow diagram that illustrates the steps of the compression method applied to a newly generated data packet according to an embodiment of the invention.

FIG. 2 shows a flow diagram that illustrates the steps of the compression method applied to a newly generated data packet according to an embodiment of the invention. The steps illustrated in FIG. 2 are performed for compressing the data packets individually as they are generated.

According to the embodiment, a packet can be compressed according to a first mode (CHAIN mode) or according to a second mode (REFERENCE mode). Therefore, in step S4, it is determined if the packet should be compressed in CHAIN mode or in REFERENCE mode. The predictability of each bit is then calculated using different criteria as determined in step S1 according to the mode. The required bit operations as determined in step S3 are therefore selected in step S5 depending on the selected mode. S5_C denotes the required bit operation in the CHAIN mode and S5_R denotes the required bit operation in the REFERENCE mode.

Figure 3:
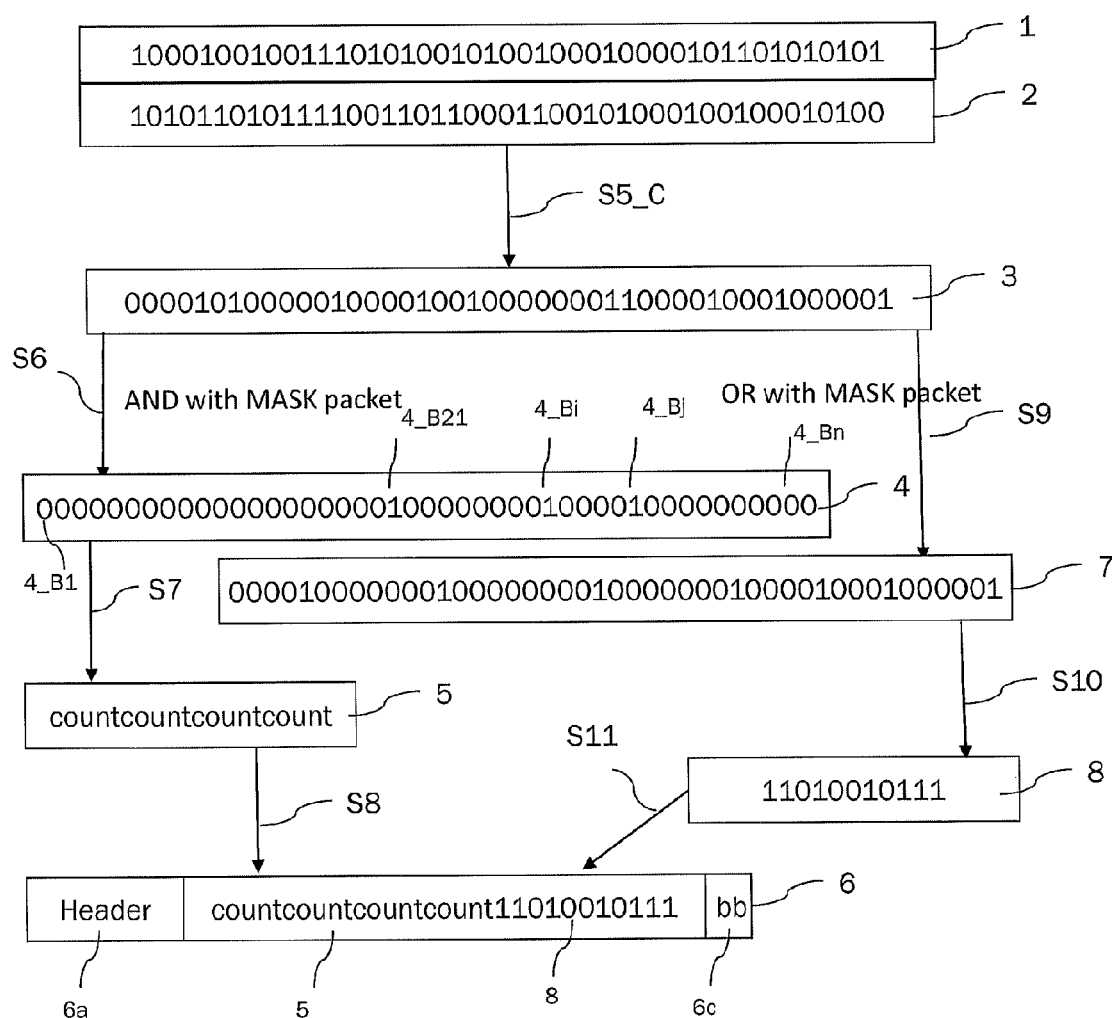
FIG. 3 illustrates exemplary the results of the compression method according to the CHAIN mode.

FIG. 3 illustrates schematically the results of the compression method according to the CHAIN mode. In the CHAIN mode, previous packet information is required since a bit state of a new data packet 2 is predicted based on the bite state of a previous data packet 1 of that packet type.

In the step S5_C, an XOR operation of a newly generated packet 2 with the last packet 1 generated of that type is performed. Hence it effectively calculates a delta from that packet to the new one. Then, XORs between bits in the resulting packet are performed as required by the XOR instruction set. For example, if the predictability figure was the result of a criteria based on correlation with another bit (either static or change) then this bit will be XORed with that bit according to the provided bit instructions. The resulting packet is also XORed with the proved inversion packet.

As a result of step S5_C, all predictable bit positions of the resulting data packet 3 have been converted into a ZERO state if an actual bit state matches the predicted bit state and all predictable bit positions are converted into a ONE state if the actual bit state does not match the predicted bit state.

In step S6, an AND operation is performed between the resulting packet 3 with the provided mask packet (not shown) to change all unpredictable bits to a ZERO state. The resulting data packet is the processed data packet 4. All bits 4_B21, 4_Bi and 4_Bj with a ONE state in the processed data packet 4 represent bits classified as predictable wherein the current bit state does not match the predicted bit state.

Figure 7A:
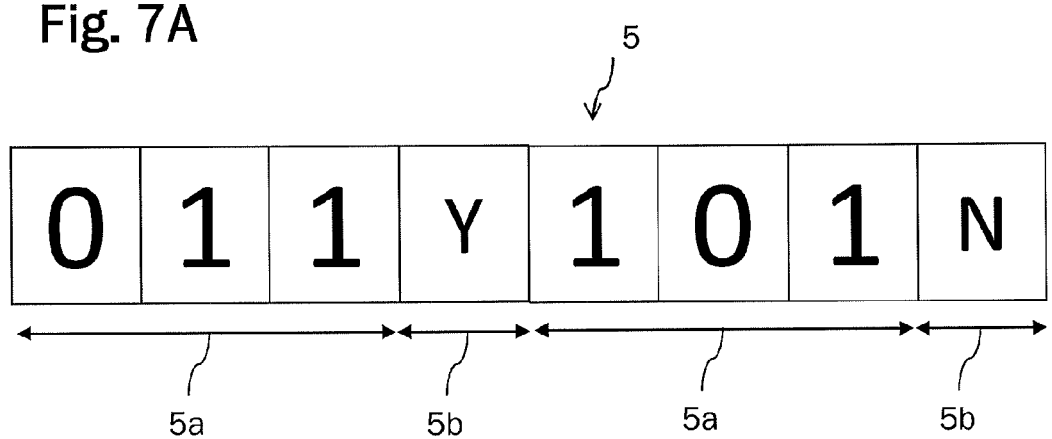
FIG. 7A illustrates schematically an expandable counter coding scheme according to an embodiment of the invention.

In step S7, the number of bits between the first bit 4_B1 in the processed packet 4 and the first bit 4_B21 with a state ONE and then between the following bits 4_Bi with a state ONE in the processed packet 4 and then between the last bit 4_Bj with a state ONE and the last bit 4_Bn in the processed packet 4 are calculated. The result of the calculation is encoded into a series 5 of counters 5a. This represents a variation of a run length encoding scheme. The series of counters 5 effectively count the number of consecutive zero bits followed by a one bit. Thus, the distance between the ONEs in the processed data packet is calculated. As illustrated in FIG. 7A, expandable counters 5 are used which introduce a status bit 5b every three counter bits to indicate if the count fields are finished or not. The scheme can code any count length.

In step S8 of FIG. 2 and FIG. 3, the counters are written into an output data packet 6.

With the following steps S9-S11, the non-predictable bits are added to the output packet 6. In step S9, an OR operation of the resulting data packet 3 with the mask packet is performed to remove the predictable bits from a data packet and in step S10, the extract bit operations on the resulting packet are performed to extract the unpredictable bits 8. The extracted unpredictable bits are then added to the output packet 6 (step S11). Alternatively, the non-compressible bit states could be extracted using an OR operation of the original/new data packet 1 with the mask packet (not shown).

In step S12, a fixed length header 6a is attached to the compressed data of each packet 6. This may include an identification number, a status bit to tell the ground it is compressed, a status bit to tell ground the POCKET mode, the length of the packet in bytes and a sequence counter to ensure that compressed packets are decompressed in order. Furthermore, the bits representing the first counter in compressed data are removed. A single one bit is added to the end of the compressed data to indicate the end. Zero bits are added to the end of the data to ensure that a complete number of bytes are achieved for the whole packet. In step S13, the new packet containing the compressed data is now transmitted to the ground (or stored in a packet store for later transmission).

Figure 4:
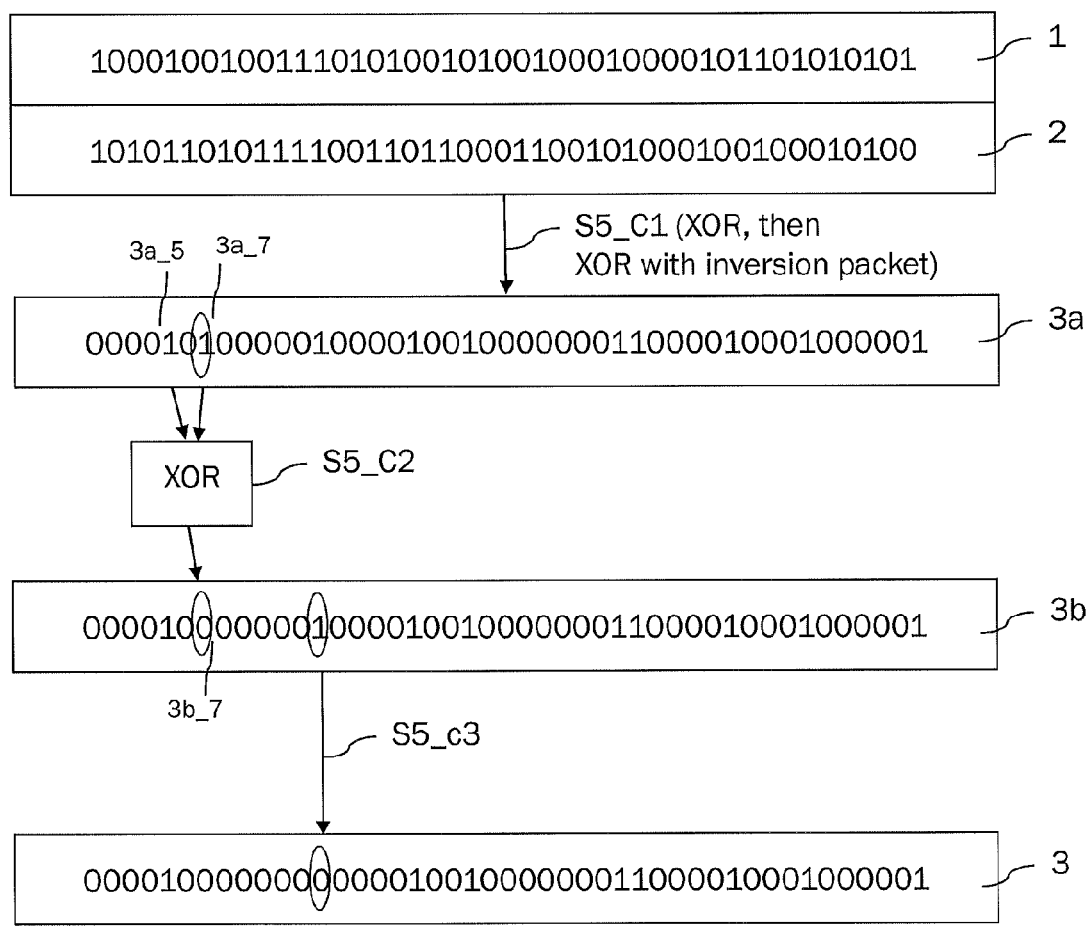
FIG. 4 illustrates exemplary the bit operations of the CHAIN mode according to an embodiment of the invention.

FIG. 4 illustrates in more detail the bit operations of the CHAIN mode that are performed on a new data packet 2 to bring all predictable bit positions of the new data packet 2 into a ZERO state if an actual bit state matches the predicted bit state and into a ONE state if the actual bit state does not match the predicted bit state. The bit operations of steps S5_C1, S5_C2 and S5_C3 represent the bit operations summarized in step S5_C in FIG. 3.

In the step S5_C1, an XOR operation of a newly generated packet 2 with the last packet 1 generated of that type is performed. The resulting packet is then XORed with the inversion packet. Some bits are flagged in the preparation instructions as being change correlated with another bit. In this case they are XORed with that bit in step S5_C2. For example, the bit 3a_7 is change correlated with bit 3b_5. The bits 3a_7 and 3a_5 are XORed, resulting in a bit 3b_7 with the value ZERO.

Some bits may be flagged in the preparation instructions as being time correlated wherein the predictability of each bit in the new data packet is based on the probability of the bit changing state each time a new packet is generated. In that case they are occasionally inverted in step S_5C3. Time correlated bits are treated so that when a ONE occurs, the number of packets generated since the last ONE is counted and an inversion of that bit state is triggered when the same number of packets have been generated in the future unless another ONE occurs in the meantime in which case the count is reset. For example, if a bit's value over time (following the XOR with the last packet) is like the following sequence: [1,0,0,0,0,1,0,0,0,0,1,0,0,0,0,1,0,0,0,0,1,0,0,0,0,1,0,0,0,0,1,0,0,0,0,1].

Then, the output after time correlation will be:

[1,0,0,0,0,1,0,0,0,0,0̲,0,0,0,0,0,0̲,0,0,0,0,0,0̲,0,0,0,0,0,0̲,0,0,0,0,0̲, 0,0,0,0,0̲,0,0,0,0,0̲];

where the underlines values represent bits that have been inverted and the commas represent a new packet. If that bit alters its change frequency, the output will follow it, for example:

[1,0,0,0,1,0,0,0,1,0,0,0,1,0,0,0,0,1,0,0,0,0,1,0,0,0,0,1,0,0,0, 0,1,0,0,0,0,1,0,0,0,0,1,]

The output is then:

[1,0,0,0,1,0,0,0,0̲,0,0,0,0̲,0,0,0,1̲,1,0,0,0,0,0̲,0,0,0,0,0̲,0,0,0, 0, 0̲,0,0,0,0,0̲,0,0,0,0,0̲]

Hence, it is not required to tell the transmitter the frequency of the change. It is sufficient to only flag it as a bit that requires time correlation treatment.

Figure 5:
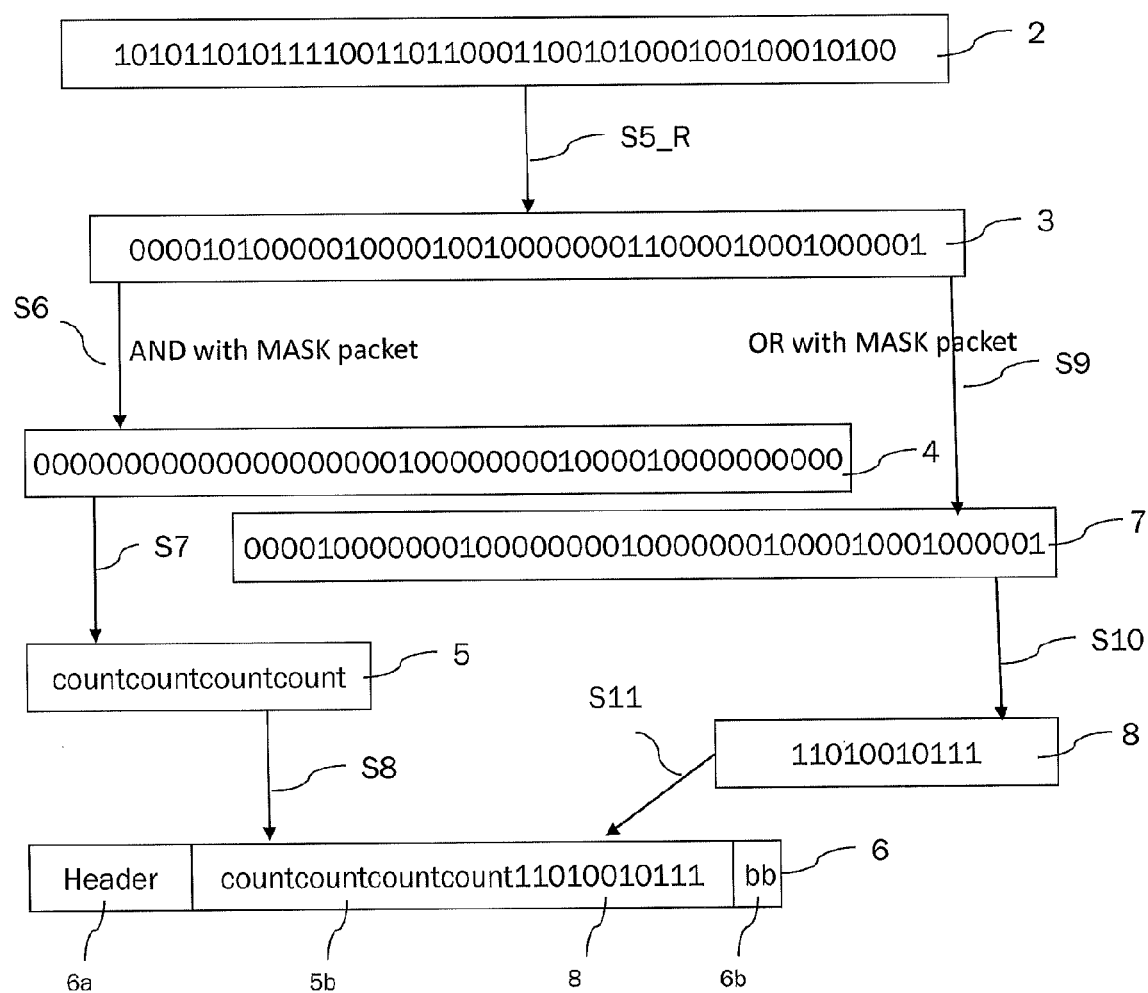
FIG. 5 illustrates exemplary the results of the compression method according to the REFERENCE mode.
Figure 6:
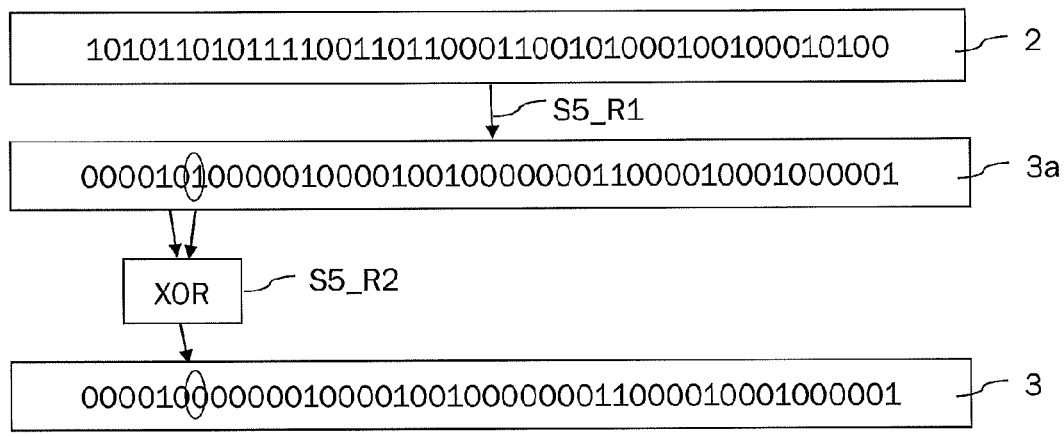
FIG. 6 illustrates schematically the bit operations of the REFERENCE mode according to an embodiment of the invention.

FIG. 5 and FIG. 6 illustrate schematically the results of the compression method according to the REFERENCE mode. The bit operations S5_R1 and S5_R2 in FIG. 6 are summarized as step S5_R in FIG. 5. In the REFERENCE mode, no previous packet information is required. The newly generated data packet 2 is not XORed with the last data packet generated for that packet type since the predictability of each bit in the data packet is based on the probability of the bit being in a static ZERO or ONE state, whichever is higher. The new data packet 2 is XORed with the inversion packet in step S5_R1, only. If some bits are flagged in the preparation instructions as being state correlated with another bit of the same packet, then these bits will be XORed with that bit in step S5_R2. The steps S6-S13 are the same as the corresponding steps of the CHAIN mode.

Figure 7B:
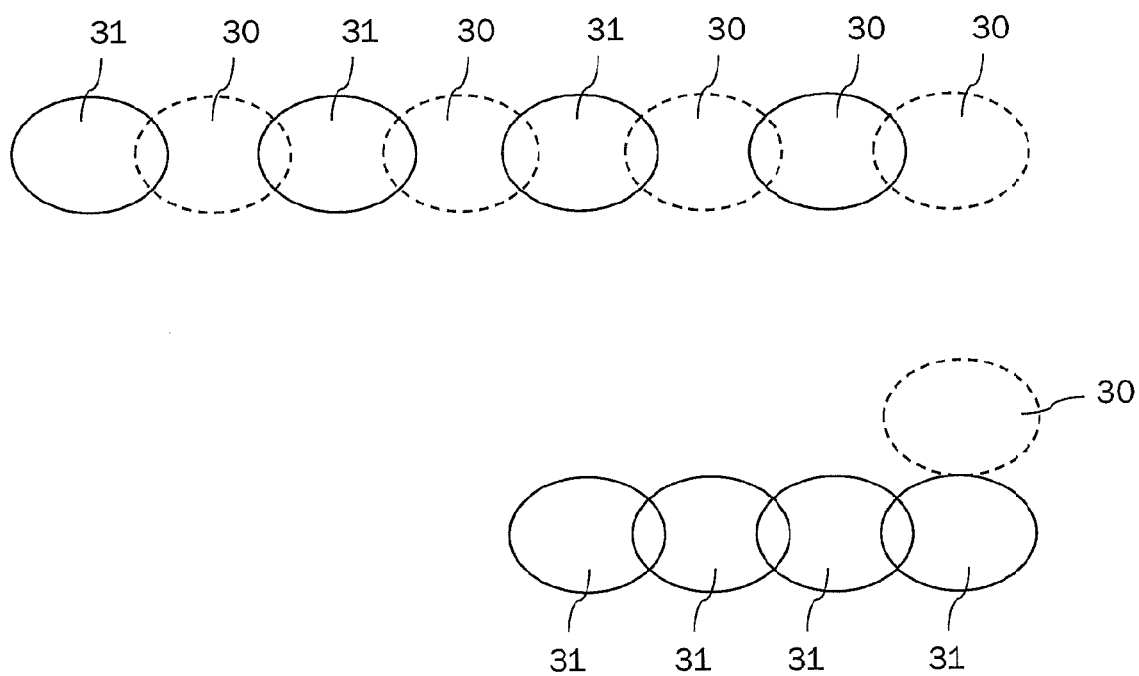
FIG. 7B illustrates schematically the combination of the CHAIN and the REFERENCE me mode according to an embodiment of the invention.

In REFERENCE mode, the compression method does not perform an XOR with a previous data packet. Hence the device that receives the transmitted compressed data can always calculate an absolute state from this packet. In CHAIN mode, the compression method XORs the new packet with the last packet generated. Hence it effectively calculates a delta from that packet to the new one. This forms a chain starting from an uncompressed packet or a packet compressed in REFERENCE mode. The CHAIN mode has the advantage that the compression performance is better but the disadvantage that if a packet is lost, the chain will be broken and further CHAIN mode packets cannot be decoded. Hence, a preferred embodiment of the invention uses a combination of REFERENCE packets (or uncompressed packets) and CHAIN mode packets. Several options are available:

A first option is to interleave a REFERENCE packet every X CHAIN packets. A simple, robust system would be to alternate between modes each packet. This is illustrated in FIG. 7B that shows sequence of packets 30 compressed in REFERENCE mode and packets 31 compressed in CHAIN mode. The maximum impact of a single packet loss is the loss of the next packet and this only occurs in 50% of the cases. A second option is to overlay a REFERENCE packet 30 every X CHAIN packets 31 (cf. lower picture in FIG. 7B). This has the advantage that backtracking can be employed. It is possible to work back from a REFERENCE packet as well as forward. A third option is to send CHAIN packets as default with the possibility to request a REFERENCE packet in real-time if the chain is broken (not shown). When considering these options one should note that option 2 and 3 do not increase the risk of packet loss, they only delay their decoding by a short period if a packet loss occurs. A further advantage of the invention is that the bandwidth released by implementing the proposed compression method can be used to reduce the chance of packet loss way below that of any known system of the prior art that does not compress packets. A simple example is to send all the packets twice. This would convert a link which lost one packet every thousand into a link that lost one packet every million.

Figure 8A:
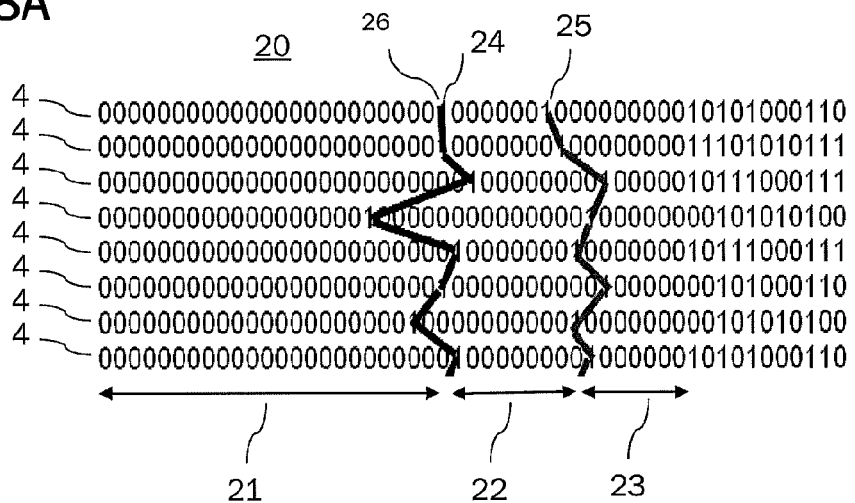
FIGS. 8A-8D illustrate schematically the generated counter time series according to an embodiment of the invention.

The bits of processed packets reordered according to their descending probability would result in a counter time series as illustrated in FIG. 8A. Statistically, the number of ZEROS between the first bit in the processed packet and the first bit with a state ONE and then between the following bits with a state ONE in the processed packet and then between the last bit with a state ONE and the last bit in the processed packet decreases if the bits are ordered according to their descending probabilities. Thus, the first sequence of ZEROS between the first bit in the processed packet and the first bit with a state ONE is coded with the first counter 21, the second sequence of ZEROS between the following bits with a state ONE is coded as the second counter 22, the next sequence of ZEROS with the third counter 23 etc.

According to a further embodiment of the invention, a lookup table can be calculated beforehand based on descending predictability of each bit based on historical data. The absolute bit positions relative to the start of the processed packet of all the bits with state ONE in that packet are then transformed into order numbers based on a lookup table. The lookup table allows exploiting the structure of the processed packet in a way as illustrated in FIG. 8C. The lookup table maps these absolute bit positions with a ONE state to order numbers, ordered based on the descending predictability of each bit. The difference between these numbers in descending order is coded into counter values. For example, given a lookup table, if bit B21 has a probability of 0.95, bit B23 of 0.88, bit B8 of 0.85 (cf. FIG. 8C), these bits may be mapped by the lookup table respectively into the order numbers 14, 17, 19 based on the descending predictability of each bit and then counter values are calculated. Order number 14 for bit B21 means that bit B21 has the $14^{th}$ highest predictability value of all bits in the data packet. The lookup table mapping the absolute bit position ("Abs") to an order number ("Order") according to the predictability of each bit is illustrated schematically in the table of FIG. 8C.

By using the look-up table that ranks the bits based on descending predictability, the bits with the highest predictability are looked up first so that the first counters usually code the longest sequence of ZEROs and thus, a single counter value can code a large amount of data.

Figure 8B:
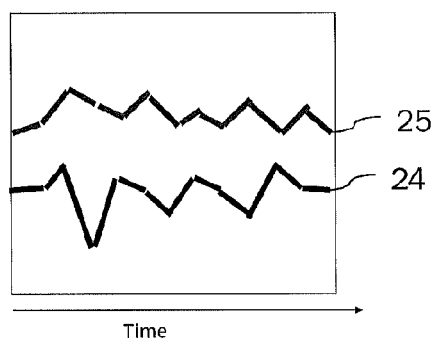
Figure 8C:
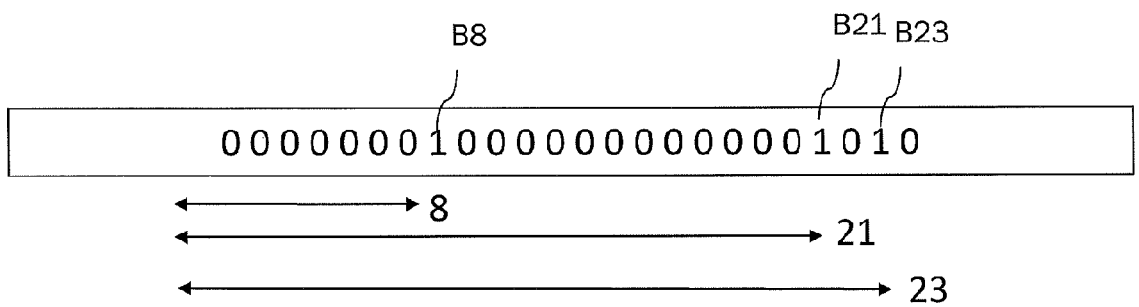

As illustrated in FIG. 8B, the proposed method results essentially in a series of counters 24, 25. They form time series which are very information rich. By treating these time series the majority of the historical data can be transferred to a central receiving unit at very high compression ratios. For example a first counter time series 24 would show the point (the bit 26 in FIG. 8A having a value of ONE) at which the first prediction is not correct for each packet compressed. All the standard treatments for time series (Out of Limits, min, max, standard deviation, vector treatment, even further compression) can be applied to these counters to allow the central unit to receive the telemetry data very fast and to monitor the system e.g. it becomes clear when low probability events are taking place on multiple parameters at the same time.

Figure 8D:
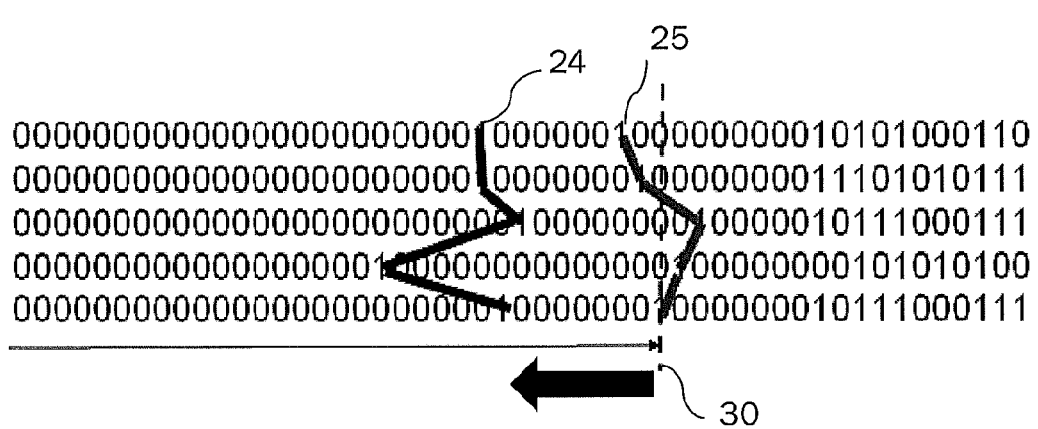

If only one time series 24 is downloaded, the amount of information that will be included will vary due to the statistical nature of predicting the bit state. Therefore, according to a further embodiment, the compression method can be set-up so that it guarantees bit information up to a certain point 30 as shown in FIG. 8D. This can be accomplished by determining a predetermined minimum threshold using the order numbers of the look-up table to guarantee bit information up to a certain point.

Figure 9:
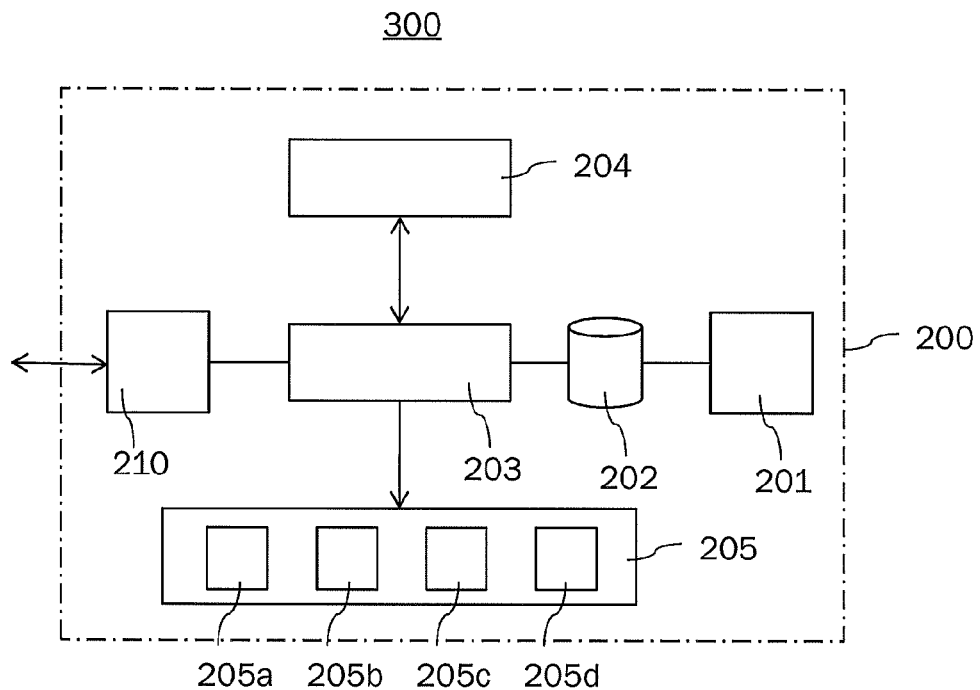
FIG. 9 shows a system for transmitting or storing of time series data according to an embodiment of the invention.
Figure 9:
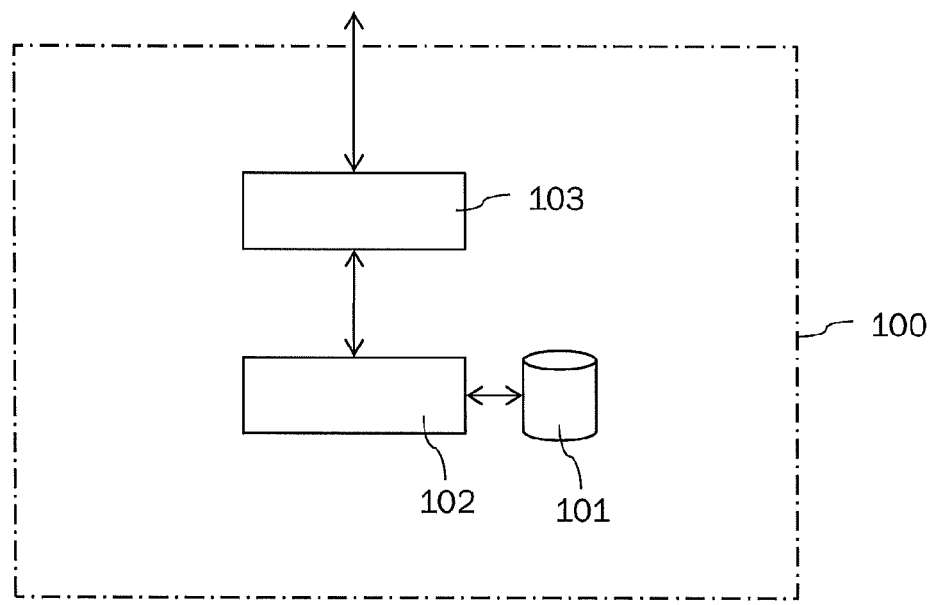

FIG. 9 illustrates schematically a system 300 for processing telemetry time series data according to an embodiment of the invention. The system 300 comprises a central base station 100 and a remote telemetry device 200. The central base station 100 comprises a central processing unit 102 configured to perform steps S1 to S3 as described above such as determining the predictability of the state of each bit in a data packet based on statistical analysis of historical data as described above. The central base station creates the mask packet with bits in a one state for all predictable bit positions and in a zero state for all unpredictable bit positions. It also determines the necessary preparation bit operations to be performed on a newly generated data packet or on a newly generated data packet and the last packet so that predictable bits are in a zero state if the prediction was correct and a one state if the prediction was incorrect. Additionally, the base station creates an XOR instruction set for performing the bit XORs part of the preparation bit operations and an inversion packet for the inversion part as well as the extract bit operations which can remove the predictable bits from a data packet created from an OR of the original data packet and the mask packet and creating an extract instruction set for this operation. The central base station comprises a sender/receiver unit 103 configured to transmit the mask packet, inversion packet, the XOR instruction set and the extract instruction set to the telemetry device 200. The central processing unit 100 is further configured to receive compressed packets from the remote device 200 and after interpreting the counters recreating the processed packet and using equivalent bit operation instructions to reconstruct the original data packet.

The telemetry device 100 comprises a data storage 205 with a first storage area 202 configured to store the last packet generated for each type of packet; a second storage area 205a configured to store at least one mask packet; a third storage area 205b configured to store at least one inversion packet; a fourth storage area 205c configured to store at least one XOR instruction set; a fifth storage area 205d configured to store at least one extract instruction set.

The telemetry device 100 further comprises a packet processing means 203 for compressing telemetric time series data, a receiver unit 210 for receiving the mask packet, inversion packet and the instruction sets; a sender unit 210 for transmitting the data packets compressed by the packet processing means. The packet processing means 203 is configured to perform the compression according steps S4 to S13 as described above. According to an embodiment, the telemetry device 200 is configured to decide for each data packet whether it should be compressed or not. The packet processor 203 can be configured to selectively compress the data packets according to a predetermined ratio of compressed to uncompressed data packets the telemetry device has received from the ground station.

The system for storing and distributing telemetry time series data further comprises a storage area 101 at the central unit 100 that stores the time series data in a compressed form and when requested by remote users for stored data sends the compressed packets along with the associated mask packet, inversion packet and instruction sets needed by the remote user to reconstruct the original data packets.

Features, components and specific details of the structure of the above-described embodiments may be exchanged or combined to form further embodiments optimized for the respective application. As far as those modifications are already apparent for an expert skilled in the art, this shall be disclosed implicitly by the above description without specifying explicitly every possible combination, for the sake of conciseness of the present description.

The invention claimed is:

1. A method for transmitting or storing of time series data, wherein the time series data is compressed using the following steps:
    Providing a pre-determined time series data of a telemetry system or a telemetry device;
    Determining a predictability of a state of each bit in a data packet on the basis of the provided time series data, wherein the bit state is predictable if its state can be predicted with a probability that is higher than a predetermined threshold and unpredictable if the probability is below or equal the predetermined threshold;
    Providing a mask packet with bits in a ONE state for all predictable bit positions of the data packet and with bits in a ZERO state for all unpredictable bit positions;
    Carrying out bit operations on a new data packet to bring all predictable bit positions of the new data packet into a ZERO state if an actual bit state matches the predicted bit state and into a ONE state if the actual bit state does not match the predicted bit state;
    Providing a processed packet by applying an AND operation between the new data packet on which the bit operations have been performed and the mask packet to change all unpredictable bits to a ZERO state;
    Providing a series of counters by calculating the number of bits in the processed packet between the first bit and the first bit with a state ONE; and between the following bits with a state ONE and then between the last bit with a state ONE and the last bit in the processed packet;
    Writing the series of counters into an output data packet; and
    Storing or transmitting the output data packet.

2. Method according to claim 1, wherein the predictability of the state of each bit in a data packet is determined based on a static prediction or a state of another bit in the packet or a state of the bit in the last packet generated or a change in state of another bit in the packet or the amount of packets generated since the last change in state of the bit, and wherein based on the selected method for determining the predictability of the state of each bit in a data packet, preparation bit operations are determined to be performed on the new data packet and/or the last packet so that predictable bits are in a ZERO state if the prediction was correct and in a ONE state if the prediction was incorrect.

3. Method according to claim 2, wherein the preparation bit operations further comprising the step of XORing the packet resulting from all other preparation bit operations with an inversion packet in order to create the processed packet, wherein the inversion packet is created beforehand with a ONE state for all bit positions that require an inversion each time and a ZERO state for those that do not.

4. Method according to claim 1, having a first mode, and further comprising the step of XORing the new data packet with the last data packet generated for that packet type, wherein the predictability of each bit in the new data packet is based on the probability of the bit changing state each time a new packet is generated.

5. Method according to claim 4, wherein the probability of each bit in the data packet changing state at the same time as another bit in the data packet is determined and if this probability is higher than the probability of the bit changing state each time, then this probability is used to determine the predictability of the state of each bit and an XOR with that bit following the step of XORing the new data packet with the last data packet generated for that packet type is chosen as one of its preparation bit operations.

6. Method according to claim 4, wherein the probability of a bit changing state an equal number of packets as between the last two changes of state for the bit is calculated and if this is higher than the probability of the bit changing state each time or it changing state at the same time as another bit in the packet then this probability is used to determine the predictability of the state of each bit and a flag is set to invert the bit in the processed packet when an equal number of packets have been generated as those that occurred between the last two state changes for that packet.

7. Method according to claim 4, wherein a combination of the first mode and the second mode is used for compressing the data packets.

8. Method according to claim 7, wherein a packet is compressed using the second mode every X packets having been compressed with the first mode.

9. Method according to claim 7, wherein a packet being compressed with the second mode is additionally provided every X packets having been compressed with the first mode.

10. Method according to claim 7, wherein data packets are compressed and transmitted using the first mode, wherein the method further comprises the step of requesting a packet being compressed in the second mode in real-time if a chain of subsequently compressed data packets is interrupted.

11. Method according to claim 1, having a second mode, wherein the predictability of each bit in the data packet is based on the probability of the bit being in a static zero or one state, whichever is higher.

12. Method according to claim 11, wherein the probability of each bit in the data packet having the same state at the same time as another bit in the data packet is calculated and if this probability is higher than the probability of the bit being in a static state then this probability is used to determine the predictability of the state of each bit and an XOR with that bit is chosen as one of its preparation bit operations.

13. Method according to claim 1, the method further comprises the steps of
Extracting the unpredictable bits from the new data packet via a set of extract bit operations; and
Writing the remaining unpredictable bits to the output data packet.

14. Method according to claim 1, wherein the non-predictable bits are extracted by performing an OR operation between the new data packet or the new data packet on which the bit operations have been performed and the mask packet to change all predictable bits to a ZERO state and then bit shifting and ORing together the words of the resulting packet to remove the ZEROs associated with the predictable bits.

15. Method according to claim 1, wherein a check is made of the number of ONEs in the processed packet and if this exceeds a threshold then the compression is terminated.

16. Method according to claim 1 for transmitting the compressed data packets in real-time, further comprising the following steps
Adding a fixed length header to the output packet, the fixed length header comprising a status bit indicating whether the data packet is compressed, the mode in which it was compressed, the length of the packet in bytes and a sequence counter to ensure that the compressed packets are decompressed in order;
Removing the first or last counter;
Adding an extra bit in a ONE state to the end of the output packet data; and
Adding the correct number of ZERO bits to the end of the output packet data to complete the number of bytes as indicated in the header.

17. Method according to claim 16, wherein instead of a byte counter being added to the header and a final bit in state ONE being added to the end of the output packet, a first counter is added which describes how many other counters there are in the packet.

18. Method according to claim 1, wherein the time series data are spacecraft housekeeping telemetry data.

19. Method according to claim 1, wherein the physically constrained, connected system is a satellite, a spacecraft, a space rover, an oil rig, a vehicle, a factory, an aircraft, a submarine or a ship.

20. Method according to claim 1, wherein the calculation of the number of bits between bits in state ONE and the start and the end of the processed packets is based on calculating word offset via memory addressing for the byte difference and then adding the bit offsets.

21. Method according to claim 1, wherein a coding of the provided counters is based on a first counter and a second counter, the first counter coding how long the second counter is in bits.

22. Method according to claim 1, wherein a coding of the counters is based on splitting the bits that make up the counter value into different groups and adding a concatenation bit after each group to indicate if a next group is concatenated or if the counter is finished.

23. Method according to claim 1, wherein the coding of the counters is performed by using a byte or bit type run length encoding scheme on the processed packet.

24. Method according to claim 1, wherein each counter is followed by a single bit flag indicating if it is followed by a bit with a ONE state and if true this is repeated until false whereby a bit flag with an opposite value is inserted and the following bits describe the next counter.

25. Method according to claim 1, wherein absolute bit positions relative to the start of the processed packet of all the bits with state ONE in that packet are transformed into order numbers based on a pre-determined lookup table, wherein the pre-determined lookup table assigns an order number to each bit based on a determined descending predictability of each bit.

26. Method according to claim 25, wherein a calculation of a counter value is based on the differences in the order numbers in descending order.

27. Method according to claim 25, wherein differences between a predetermined minimum number and subsequent higher order numbers are passed to a separate process which stores and transmits them separately to the compressed packets.

28. Method according to claim 1, wherein the provided series of counters and selected non-predictable bit states are stored in separate packets and transmitted separately to packets containing the rest of the non-predictable bit states.

29. A central base station for processing and receiving time series data of a telemetry system or device, comprising a central processing unit configured to:
Determine the predictability of the state of each bit in a data packet based on a static prediction or the state of another bit in the packet or the state of the bit in the last packet generated or a change in state of another bit in the packet or the amount of packets generated since the last change in state of the bit;
Determine for each bit in the data packet whether its state is predictable by determining whether its state can be predicted with a better probability than a predetermined threshold;

Provide a mask packet with bits in a ONE state for all predictable bit positions and in a ZERO state for all unpredictable bit positions;

Provide an XOR instruction set that transforms a newly generated data packet and a last packet generated for that packet type in a data packet wherein predictable bits are in a ZERO state if the prediction was correct and a ONE state if the prediction was incorrect;

Determine extract bit operations for removing the predictable bits from the newly generated data packet created from an OR of the newly generated data packet or the newly generated that has been transformed using the XOR instruction set and the mask packet and providing an extract instruction set for this operation;

the central base station further comprising a sender/receiver unit configured to transmit the mask packet, inversion packet, the XOR instruction set and the extract instruction set to the telemetry system or device.

30. The central base station according to claim 29, further configured to receive compressed packets from the telemetry system or device and after processing counters included in the compressed packets, to recreate a processed packet and to use equivalent bit operation instructions to reconstruct the original data packet.

31. The central base station according to claim 29, further configured regularly providing updated version of the mask packets, inversion packets and instruction sets based on newly generated historical telemetry time series data.

32. A telemetry device configured to compress and transmit time series data, comprising a first storage area configured to store the last packet generated for each type of packet; a second storage area configured to store at least one mask packet; a third storage area configured to store at least one inversion packet; a fourth storage area configured to store at least one XOR instruction set; a fifth storage area configured to store at least one extract instruction set; a packet processing means for compressing telemetric time series data, a receiver configured to receive the mask packet, inversion packet and the instruction sets; a sender unit configured to transmit the data packets compressed by the packet processing means; wherein the packet processing means is configured to Carry out an XOR of a newly generated packet with the last packet generated of that type, if the predictability of the state of each bit in a data packet is determined based on a state of a bit or a change in state of another bit;

Carrying out XORs between bits in the resulting packet according to the XOR instruction set;

XOR the resulting packet with the inversion packet;

AND the resulting packet with the mask packet to provide a processed packet;

Calculating the number of bits between the first bit in the processed packet and the first bit with a state ONE and then between the following bits with a state ONE in the processed packet and then between the last bit with a state ONE and the last bit in the processed packet;

Provide the results of the calculations as counters;

Write the counters into an output data packet.

33. The telemetry device according to claim 32, further configured to OR the original data packet with the mask packet;

Carry out the extract bit operations on the resulting packet;

Write the result into the output data packet;

Append a fixed length header to the output data packet, add a one bit at the end of the data, add zero bits to complete the exact number of bytes as described in the header; and Transmit the packet to the base station.

34. The telemetry device according to claim 32, further configured to decide for each data packet whether it should be compressed or not.

35. The telemetry device according to claim 32, wherein the packet processor selectively compresses the data packets according to a predetermined ratio of compressed to uncompressed data packets the telemetry device has received from a central base station.

36. A system for storing and transmitting telemetry time series data, comprising a central base station according to claim 29 and a remote telemetry device configured to compress and transmit time series data, comprising a first storage area configured to store the last packet generated for each type of packet; a second storage area configured to store at least one mask packet; a third storage area configured to store at least one inversion packet; a fourth storage area configured to store at least one XOR instruction set; a fifth storage area configured to store at least one extract instruction set; a packet processing means for compressing telemetric time series data, a receiver configured to receive the mask packet, inversion packet and the instruction sets; a sender unit configured to transmit the data packets compressed by the packet processing means; wherein the packet processing means is configured to Carry out an XOR of a newly generated packet with the last packet generated of that type, if the predictability of the state of each bit in a data packet is determined based on a state of a bit or a change in state of another bit;

Carrying out XORs between bits in the resulting packet according to the XOR instruction set;

XOR the resulting packet with the inversion packet;

AND the resulting packet with the mask packet to provide a processed packet;

Calculating the number of bits between the first bit in the processed packet and the first bit with a state ONE and then between the following bits with a state ONE in the processed packet and then between the last bit with a state ONE and the last bit in the processed packet;

Provide the results of the calculations as counters;

Write the counters into an output data packet.

* * * * *